310-335 SR

3/26/85 XR 4,507,582

United States Patent [19]

Glenn

[11] Patent Number: 4,507,582

[45] Date of Patent: Mar. 26, 1985

[54] MATCHING REGION FOR DAMPED PIEZOELECTRIC ULTRASONIC APPARATUS

[75] Inventor: William E. Glenn, Ft. Lauderdale, Fla.

[73] Assignee: New York Institute of Technology, Old Westbury, N.Y.

[21] Appl. No.: 427,897

[22] Filed: Sep. 29, 1982

[51] Int. Cl.[3] ............ H01L 41/08

[52] U.S. Cl. ............ 310/327; 310/334; 310/335; 310/336; 73/644

[58] Field of Search ............ 310/326, 327, 334–337; 73/642, 644; 367/162

[56] References Cited

U.S. PATENT DOCUMENTS 2,833,991 5/1958 Howry ............ 310/334 X
3,995,179 11/1976 Flournoy et al. ............ 310/327

FOREIGN PATENT DOCUMENTS 338621 7/1959 Switzerland ............ 73/644
738941 10/1955 United Kingdom ............ 73/644

*Primary Examiner*—Mark O. Budd
*Attorney, Agent, or Firm*—Martin Novack

[57] ABSTRACT

An acoustic impedance match between an ultrasonic transducer and an adjacent transmission medium is obtained, with performance over a relatively wide bandwidth, by providing a special matching region between the transducer and the transmission medium. The matching region includes a layer having a multiplicity of tapered elements. Each of the elements tapers down in size in the direction away from the transducer.

48 Claims, 8 Drawing Figures

MATCHING REGION FOR DAMPED PIEZOELECTRIC ULTRASONIC APPARATUS

BACKGROUND OF THE INVENTION

This invention relates to the investigation of objects with ultrasound, and, more particularly, to improvements in the efficient coupling of ultrasonic energy between a transducer and a transmission medium. The invention is especially useful in ultrasonic imaging systems.

In recent years ultrasonic techniques have become more prevalent in clinical diagnosis. Such techniques have been utilized for some time in the field of obstetrics, neurology and cardiology, and are becoming increasingly important in the visualization of subcutaneous blood vessels including imaging of smaller blood vessels.

Various fundamental factors have given rise to the increased use of ultrasonic techniques. Ultrasound differs from other forms of radiation in its interaction with living systems in that it has the nature of a mechanical wave. Accordingly, information is available from its use which is of a different nature than that obtained by other methods and it is found to be complementary to other diagnostic methods, such as those employing X-rays. Also, the risk of tissue damage using ultrasound appears to be much less than the apparent risk associated with ionizing radiations such as X-rays.

The majority of diagnostic techniques using ultrasound are based on the pulse-echo method wherein pulses of ultrasonic energy are periodically generated by a suitable piezoelectric transducer such as lead zirconate-titanate ceramic. Each short pulse of ultrasonic energy is focused to a narrow beam which is transmitted into the patient's body wherein it eventually encounters interfaces between various different structures of the body. Where there is a characteristic impedance mismatch at an interface, a portion of the ultrasonic energy is reflected at the boundary back toward the transducer. After generation of the pulse, the transducer operates in a "listening" mode wherein it converts received reflected energy or "echoes" from the body back into electrical signals. The time of arrival of these echoes depends on the ranges of the interfaces encountered and the propagation velocity of the ultrasound. Also, the amplitude of the echo is indicative of the reflection properties of the interface and, accordingly, of the nature of the characteristic structures forming the interface.

There are various ways in which the information in the received echoes can be usefully presented. In one common technique, the electrical signals representative of detected echoes are amplified and applied to the vertical deflection plates of a cathode ray display. The output of a time-base generator is applied to the horizontal deflection plates. Continuous repetition of the pulse/echo process in synchronism with the time-base signals produces a continuous display, called an "A-scan", in which time is proportional to range, and deflections in the vertical direction represent the presence of interfaces. The height of these vertical deflections is representative of echo strength.

Another common form of display in the so-called "B-scan" wherein the echo information is of a form more similar to conventional television display; i.e., the received echo signals are utilized to modulate the brightness of the display at each point scanned. This type of display is found especially useful when the ultra sonic energy is scanned transverse the body so tha individual "ranging" information yields individual scar lines on the display, and successive transverse position are utilized to obtain successive scanlines on the display This type of technique yields a cross-sectional picture i the plane of the scan, and the resultant display can b viewed directly or recorded photographically or o magnetic tape. The transverse scan of the beam may b achieved by a reflector which is scanned mechanicall over a desired angle.

In systems of the type described, it is desirable t couple, with maximum efficiency, ultrasound powe from the transducer into the adjacent transmission me dium. Typically, the ultimate transmission medium is fluid such as water, although an ultrasound lens, forme for example of plastic, may be disposed between th transducer and the transmission fluid. In either case, it i also desirable that the wave energy be efficiently trans ferred to the transmission medium over a relativel wide bandwidth, thereby enhancing range resolution b virtue of return echo signals having a relatively wid bandwidth. Considerations of sufficient power transfe from the transmission medium to the transducer als come into play in the same fashion (during "listening" for return echo signals). Unfortunately, the acousti impedance of the piezoelectric crystals employed a transducers is quite different from the acoustic impe dance of typical transmission medium, be it water or focusing lens (such as a plastic focusing lens). Conven tional matching techniques can be employed to provid matching between the transducer crystal and the trans mission medium, this matching typically being provide at the resonant frequency of the crystal. For example the matching can be of the type wherein one employs quarter-wave matching section whose acoustic impe dance is the geometric mean between that of the piezo electric crystal and that of the transmission medium However, such techniques generally result in a rela tively narrow bandwidth power spectrum of the signa transmitted into the transmission medium. The conse quence is a relatively narrow bandwidth return signa which can result in a relatively poor resolution image It has been further suggested that the effective band width of operation could be broadened by using a back ing material for the transducer which is highly lossy an has approximately the same acoustic impedance as th transducer crystal. However, this technique has bee found to be of limited effectiveness, and it is difficult t find materials having the appropriate physical proper ties along with the stated loss and acoustic impedanc characteristics.

It is among the objects of this invention to provide a improved matching region for efficiently coupling rela tively broadband ultrasonic energy to a transmissio medium, these improvements being responsive to th type of prior art problems just set forth.

SUMMARY OF THE INVENTION

Applicant has discovered that an acoustic impedanc match between an ultrasonic transducer and an adjacen transmission mediun can be obtained, with performanc over a relatively wide bandwidth, by providing a spe cial matching region between the transducer and th transmission medium. In the acoustics art, it is know that a horn, such as an exponentially or hyperbolicall shaped horn, can provide an impedance match betwee two areas over a relatively wide frequency range. The horn typically will taper geometrically (i.e., either exponentially or hyperbolically) between two dissimilar areas to be matched to achieve the desired effect. In the present instance, where a thin wafer-like transducer is generally employed to obtain a beam whose aperture is to be about the same as the periphery of the transducer, this type of tapered geometrical matching would appear to be inapplicable. However, applicant achieves matching over a substantial bandwidth by providing a matching region which includes a layer having a multiplicity of tapered elements. Each of the elements tapers down in size in the direction away from the transducer (and toward the transmission medium). In this manner, the acoustic impedance of the matching region gradually tapers to provide a smoother match between the two otherwise unmatched acoustic impedances; i.e., the relatively high acoustic impedance of the transducer and the relatively low acoustic impedance of the transmission medium. It is desirable that the material of the layer (including the tapered elements, which are part of the layer) have acoustic impedance that is approximately the same as that of the transducer material, but have an ultrasound propagation velocity that is approximately the same as the transmission medium, the velocity match helping to minimize shedding of energy so as to maintain a plane-wave type of operation. The tapered elements might also be expected to scatter sound due to the mechanical taper thereof. However, if the tapered elements are disposed in a regular pattern whose spacing is equal to or less than about the wavelength of the highest frequency ultrasound being transmitted, the first order diffraction angle of this pattern will be greater than 90° and no substantial energy will appear outside the main beam.

In illustrated embodiments of the invention, the tapered elements are shown as being wedge-shaped elongated elements or generally cone-shaped elements, although they may take other forms. Preferably, the mechanical taper should be shallow enough to give a low frequency cutoff that is lower than a selected minimum threshold value. Applicant has found that a reasonably broad bandwidth can be achieved if the wedge angle (formed at the bases of the tapered elements with respect to the direction of the axis of the transducer) is less than about 20 degrees and the tapered elements are longer than about two wavelengths of the ultrasound energy.

Further features and advantages of the invention will become more readily apparent from the following detailed description when taken in conjunction with the accompanying drawings.

DESCRIPTION OF THE PREFERRED EMBODIMENT

Figure 1:
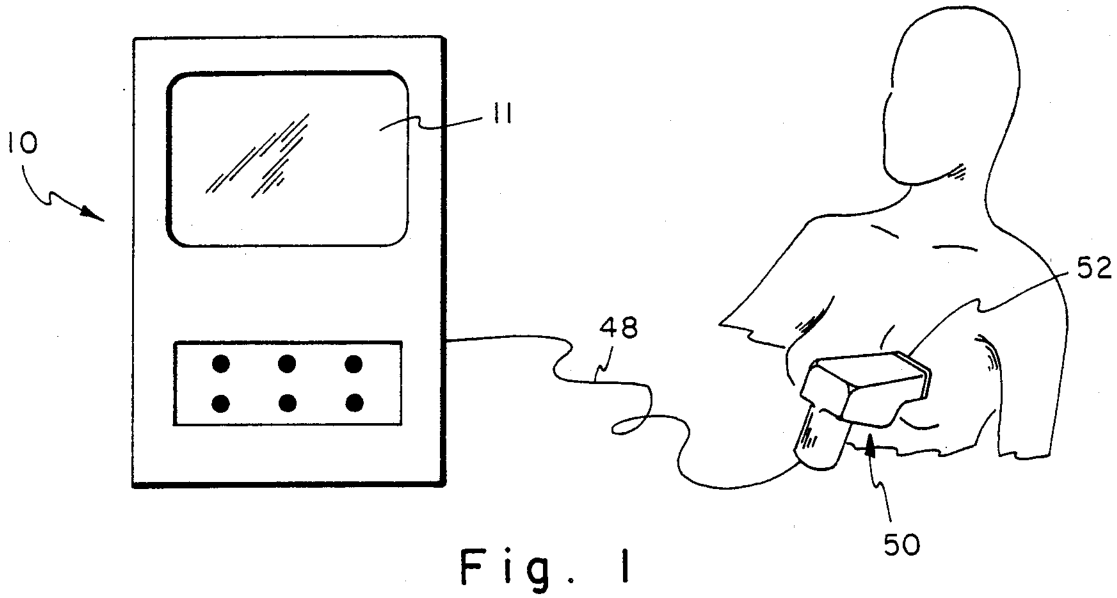
FIG. 1 illustrates the operation of a scanning apparatus which employs the improvements of the invention.

Referring to FIG. 1, there is shown an illustration of a scanning apparatus which employs the improvements of the invention. A console 10 is provided with a display 11 which may typically be a cathode ray tube television-type display, and a suitable control panel. A video tape recorder or suitable photographic means may also be included in the console to effect ultimate display of images. The console will typically house power supplies and portions of the timing and processing circuitry of the system to be described. A portable scanning module or probe 50 is coupled to the console by a cable 48. In the present embodiment the probe is generally cylindrical in shape and has a scanning window 52 near one end. During operation of the apparatus, the probe 50 is hand-held to position the scanning window over a part of the body to be imaged. For example, in FIG. 1 the probe is positioned such that a cross section of the breast will be obtained. Imaging of other portions of the body is readily attained by moving the probe to the desired position and orientation, the relative orientation of the scanning window determining the angle of the cross section taken.

Figure 2:
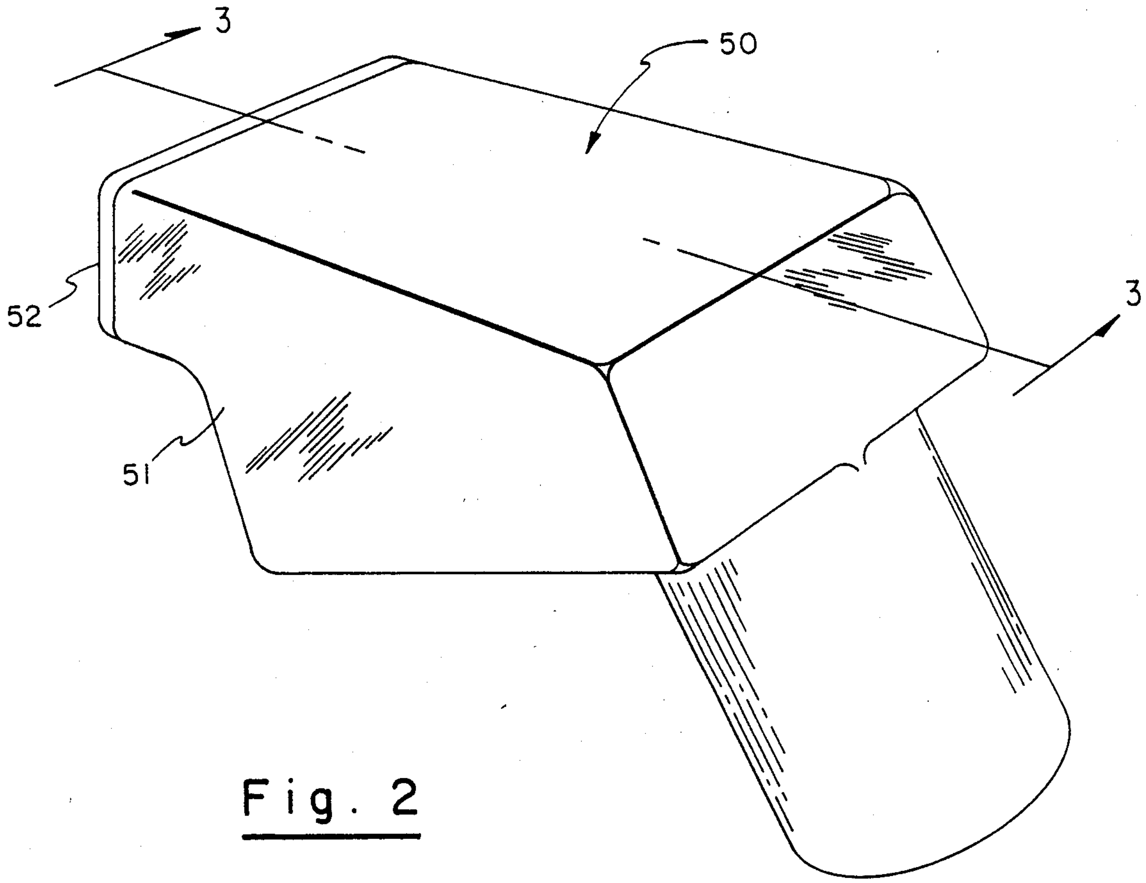
FIG. 2 is an elevational perspective view of an embodiment of the scanning module of the FIG. 1 apparatus.
Figure 3:
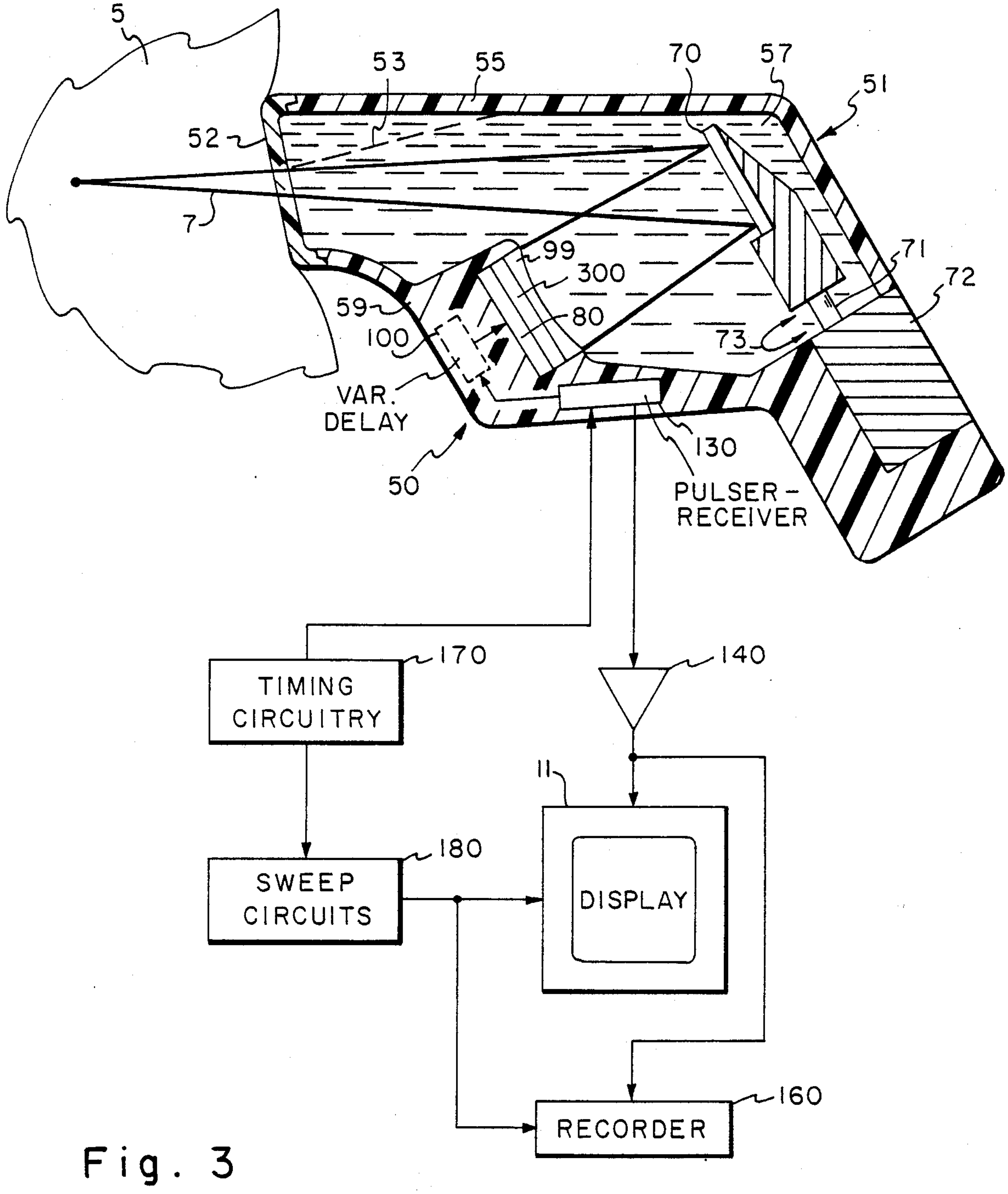
FIG. 3 shows a cross-sectional view of the scanning module of FIG. 2 as taken through a section defined by arrows 3—3, along with diagrams of portions of circuitry therein and in the accompanying console.

Referring to FIG. 2, there is shown a cross-sectional view of a portion of the scanning module or probe 50 along with diagrams of portions of the circuitry therein and in console 10 used in conjunction therewith. An enclosure 51, which may be formed of a sturdy plastic, has scanning window 52 at the front end thereof. The enclosure 51 is filled with a suitable fluid 57, for example, water. The scanning window 52 is relatively flat and may be formed, for example, of methyl methacrylate or nylon. A reflective scanner 70, which is flat in the illustration, but which may be curved to provide focusing if desired, is positioned at the approximate rear of the enclosure 51 and substantially faces the window 52. The scanner 70 is mounted on a shaft 71 which passes through a suitable seal and is connected to an electric motor 72 which is mounted in a recess in enclosure 51 and is driven to provide the desired oscillatory motion of scanner 70, as depicted by curved two-headed arrow 73.

An ultrasonic transducer 80, a matching region 300 in accordance with the invention, and a focusing lens 99, are mounted in stacked relationship in a compartment 59 of enclosure 51. The transducer is mounted relatively frontwardly of reflective scanner 70 in the module 50 with the ultrasound-emitting face of the transducer generally facing rearwardly in the module 50 and being directed toward the reflective scanner 70. As described in my U.S. Pat. No. 4,246,791, assigned to the same assignee as the present application, the transducer 80 is positioned such that the ultrasound beam which it emits is reflected by the scanner 70 to double back past transducer 80 before passing through the window 52. The scanner preferably has a reflective surface formed of a material which results in a relatively small critical angle so that the beam impinging almost directly on the reflector surface will not pass through the reflector. The described arrangement makes efficient use of the volume of fluid 57 in the module 50 since the beam 7 is effectively "doubling back" past the transducer and experiencing a relatively large travel distance through a relatively small volume of water.

A pulser/receiver circuit 130 alternately provides energizing pulses to and receives echo signals from the transducer 80. As used herein, the term pulser/receiver is intended to include any combined or separate circuits for producing the energizing signals for the transducer and receiving echo signals therefrom. If dynamic focusing is employed, the transducer 80 may be segmented and the pulser/receiver circuitry 130 may be coupled to the segments of transducer 80 via variable delay circuitry 100, shown in dashed line. The pulser/receiver circuitry 130 and the variable delay circuitry 100 (if present) are typically, although not necessarily, located in the scanning module 50, for example, within the compartment 59. The receiver portion of circuit 130 is coupled through an amplifier 140 to display 11 and to recorder 160, which may be any suitable recording, memory, and/or photographic means, for example, a video tape recorder. Timing circuitry 170 generates timing signals which synchronize operation of the system, the timing signals being coupled to pulser/receiver 130 and also to sweep circuitry 180 which generates the signals that control the oscillations of scanner 70 and the vertical and horizontal sync signals for the display 11 and recorder 160. If dynamic focusing is employed, as described in U.S. Pat. No. 4,235,560, assigned to the same assignee as the present application, the timing signals may also be coupled to phase control circuitry (not shown) which produces signals that control the variation of the delays in variable delay circuit 100. Also, lens 99, which typically has a relatively flat surface bonded to the matching region 300 and a curved concave surface which provides focusing, is employed in the scanning module 50 of the illustrated embodiment. The lens may be formed of a plastic material with the material being selected in accordance with the principles set forth in U.S. Pat. No. 3,958,559, assigned to the same assignee as the present application. As disclosed in that patent, by selecting the lens material in accordance with specified parameters, "apodization" is achieved; i.e., undesired side lobes, caused by factors such as finite transducer size, are minimized. Further, as disclosed in the referenced patent, the lens may have a generally elliptical contour to attain advantageous focusing characteristics. The transducer, matching region, and focusing lens may also have conforming elliptical peripheries which are elongated along the direction of scan, as described in my U.S. Pat. No. 4,248,090, which is assigned to the same assignee as the present application. However, for ease of illustration, circular peripheries shall be shown herein.

Operation of the system is as follows: Upon command from the timing circuits, the pulser in circuitry 130 generates pulses which excite the transducer 80, the segments of transducer 80 being excited when dynamic focusing is employed.

The beam of ultrasound resulting from pulsing the transducer is reflected by reflector 70 through the window 52 and into the body 5. The timing circuitry now causes the pulser/receiver 130 to switch into a "receive" or "listen" mode. (If dynamic focusing is employed, a cycle of the phase control circuitry would be activated.) Now, as the ultrasound echoes are received from the body via window 52 and reflected off scanner 70 toward transducer 80, the transducer serves to convert the received ultrasound energy into electrical signals. For a two-dimensional "B-scan" display, a sweep over the range of depth corresponds to a horizontal scanline of the display, so the timing signals from circuitry 170 synchronize the horizontal sync of the display such that the active portion of one scanline of the display corresponds to the time of arrival of echoes from a given range within the body 5, typically from the patient's skin up to a fixed preselected depth in the body. The second dimension of the desired cross-sectional image is attained by the slower mechanical scan of reflective scanner 70 which is synchronized with the vertical sweep rate of the display and recorder by the sweep circuitry 180. The received signals are coupled through amplifier 140 to display 11 wherein the received signals modulate the brightness of the scanning raster to obtain the desired cross-sectional image, with each scanline of the display representing a depth echo profile of the body for a particular angular orientation of the scanner 70. The received signals are also recorded on the video tape recorder 160.

Figure 4:
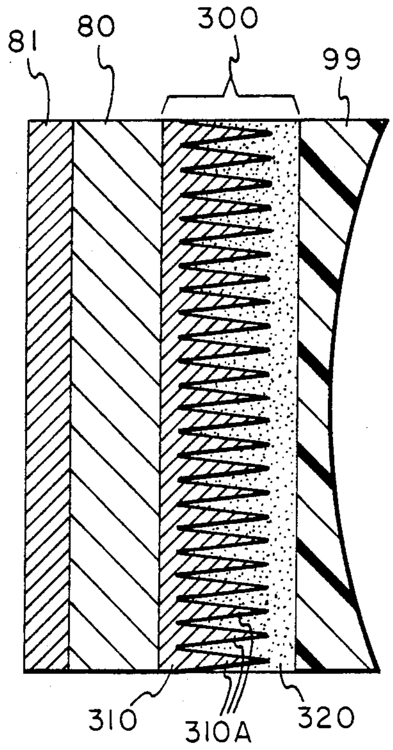
FIG. 4 is a cross-sectional view of the transducer, matching region, and lens of the scanning module of FIG. 3.

Referring to FIG. 4, there is shown a cross-sectional view of transducer 80, lens 99, and the matching region 300 in accordance with the present embodiment of the invention. In this embodiment the transducer 80 is a lead zirconate titanate crystal (PZT5A) cut with a resonant frequency of approximately 6.5 MHz. The acoustic impedance of this material is about $30\times10^6$ kg/m$^2$-sec. The transducer 80 is bonded to a thin brass backing layer 81. As noted above, the lens 99 is preferably formed of a plastic material, such as Styrolux. The acoustic impedance of this material is about $2.4\times10^6$ kg/m-sec. The matching region 300 includes a layer 310 having a multiplicity of tapered elements 310A protruding from the surface of said layer which faces the lens 99. In the present embodiment the matching region 300 includes a plastic adhesive 320 disposed between lens 99 and the interstices of the tapered elements of layer 310. The plastic adhesive may be polystyrene adhesive which has an acoustic impedance that is about the same as that of lens 99. The layer 310, in this embodiment, is formed of tin-lead solder (a 50—50 alloy), which applicant has found to have an acoustic impedance close to that of PZT (i.e., about $30\times10^6$ kg/m-sec) while having a characteristic ultrasound propagation velocity that is about the same as the characteristic ultrasound velocity of the plastic lens 99 and plastic adhesive 320.

Figure 5:
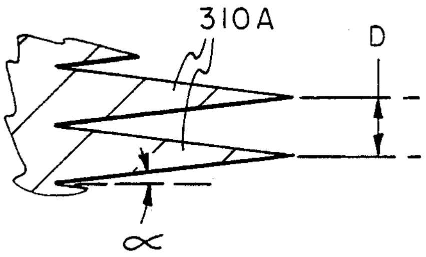
FIG. 5 is a broken away view of a portion of layer 310 of FIG. 4.

The tapered elements 310A of layer 310 are disposed in a regular pattern with a spacing between element centers (e.g. D in FIG. 5) which is equal to or less than about the wavelength of the highest frequency ultrasound to be transmitted. The taper of the elements 310A should be shallow enough to result in a low frequency cutoff that does not unduly restrict the operating bandwidth.

Figure 6:
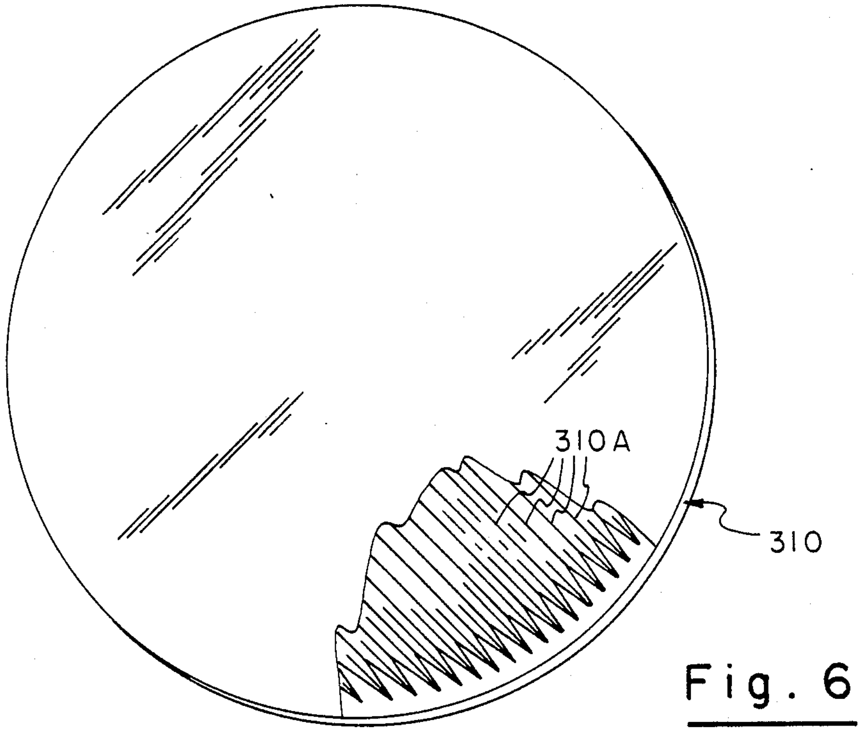
FIG. 6 illustrates, in broken away form, a portion of the layer 310 of FIG. 3 in accordance with an embodiment of the invention.
Figure 7:
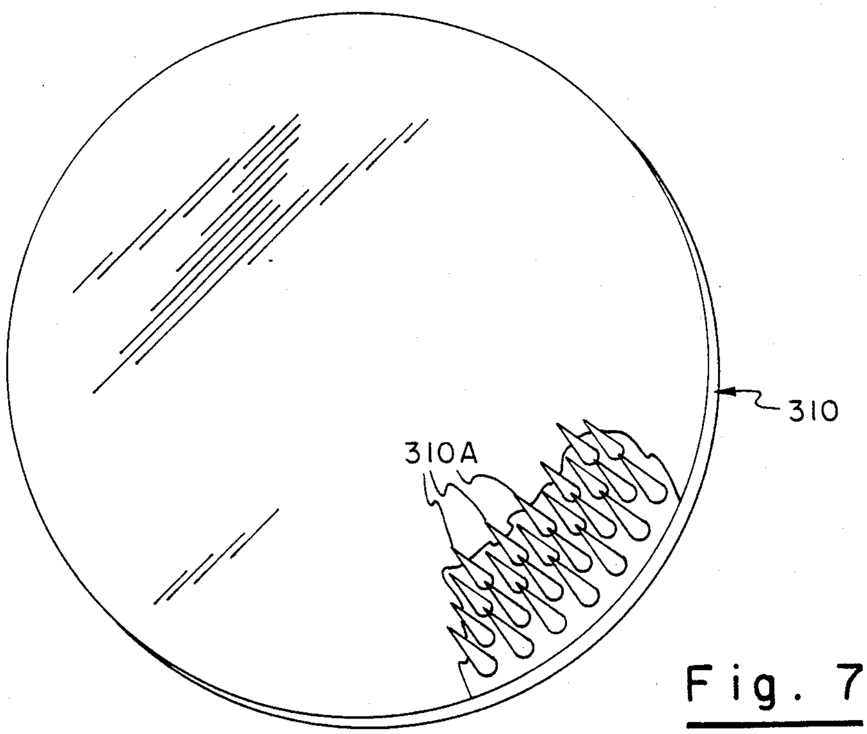
FIG. 7 illustrates, in broken away form, a portion of the layer 310 of FIG. 3 in accordance with another embodiment of the invention.

FIGS. 6 and 7 illustrate, in broken away form, two examples of the layer 310 and representative tapered elements 310A. In the embodiment of FIG. 6, the tapered elements are elongated side-by-side wedge-shaped elements that are elongated in the plane perpendicular to the axis of layer 310 (and the axis of the transducer). In the embodiment of FIG. 7, the tapered elements 310A are side-by-side generally cone-shaped units. It will be understood that the same effect can be achieved using other shapes and configurations, such as semi-cylindrical rows (similar to the rows of wedges of FIGS. 6), or truncated cones, horns, or the like. The layer 310 can be formed by molding, machining, or any other suitable technique.

Figure 8:
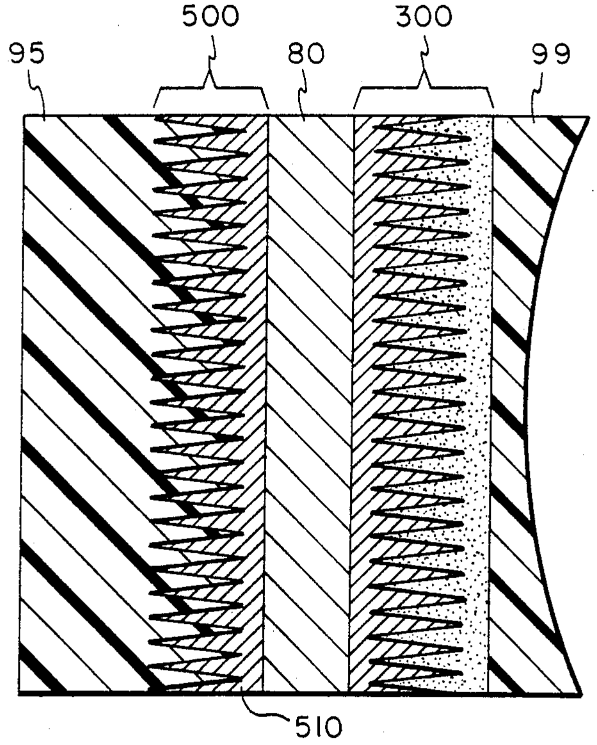
FIG. 8 is a cross-sectional view of an embodiment of the invention which includes a matching region on the back of the transducer.

Referring to FIG. 8, there is shown an embodiment including a transducer 80, matching region 300, and lens 99, as in FIG. 4, but wherein a further matching region 500 is used on the backside of transducer 80 to match into a damping material 95. The matching region 500 comprises a layer 510 that has a structure similar to the layer 310, and may also be formed of tin-lead solder. The lossy material 95 may be, for example, tungsten-filled epoxy.

I claim:

1. In an apparatus wherein ultrasonic energy is communicated between an ultrasonic transducer and a transmission medium, the improvement comprising:

a matching region disposed between a surface of said transducer and said medium, said matching region including a layer having a multiplicity of tapered elements, each of said elements tapering down in size in the direction away from said transducer and toward said medium;

a damping material; and another matching region disposed between an opposing surface of said transducer and said damping material, said another matching region including another layer having a multiplicity of tapered elements, each of said elements of said another layer tapering down in size away from said transducer.

2. Apparatus as defined by claim 1, wherein each of said multiplicity of tapered elements comprise side-by-side generally wedge-shaped elements that are elongated in the plane perpendicular to the axis of said transducer.

3. Apparatus as defined by claim 1, wherein each of said multiplicity of tapered elements comprises a multiplicity of generally cone-shaped elements.

4. Apparatus as defined by claim 1, wherein said elements are disposed in a regular pattern and have a spacing therebetween which is equal to or less than about the wavelength of the highest frequency ultrasound to be transmitted by said transducer.

5. Apparatus as defined by claim 2, wherein said elements are disposed in a regular pattern and have a spacing therebetween which is equal to or less than about the wavelength of the highest frequency ultrasound to be transmitted by said transducer.

6. Apparatus as defined by claim 3, wherein said elements are disposed in a regular pattern and have a spacing therebetween which is equal to or less than about the wavelength of the highest frequency ultrasound to be transmitted by said transducer.

7. Apparatus as defined by claim 1, wherein each of said layers has said multiplicity of tapered elements disposed on the surface thereof which faces away from said transducer, and wherein the wedge angle formed at the bases of said elements with respect to the direction of the axis of said transducer is less than about 20 degrees.

8. Apparatus as defined by claim 2, wherein each of said layers has said multiplicity of tapered elements disposed on the surface thereof which faces away from said transducer, and wherein the wedge angle formed at the bases of said elements with respect to the direction of the axis of said transducer is less than about 20 degrees.

9. Apparatus as defined by claim 3, wherein each of said layers has said multiplicity of tapered elements disposed on the surface thereof which faces away from said transducer, and wherein the wedge angle formed at the bases of said elements with respect to the direction of the axis of said transducer is less than about 20 degrees.

10. Apparatus as defined by claim 4, wherein each of said layers has said multiplicity of tapered elements disposed on the surface thereof which faces away from said transducer, and wherein the wedge angle formed at the bases of said elements with respect to the direction of the axis of said transducer is less than about 20 degrees.

11. Apparatus as defined by claim 1, wherein said medium comprises a plastic focusing lens, and wherein said matching region further includes a plastic adhesive disposed between said layer and said lens.

12. Apparatus as defined by claim 4, wherein said medium comprises a plastic focusing lens, and wherein said matching region further includes a plastic adhesive disposed between said layer and said lens.

13. Apparatus as defined by claim 7, wherein said medium comprises a plastic focusing lens, and wherein said matching region further includes a plastic adhesive disposed between said layer and said lens.

14. Apparatus as defined by claim 10, wherein said medium comprises a plastic focusing lens, and wherein said matching region further includes a plastic adhesive disposed between said layer and said lens.

15. Apparatus as defined by claim 1, wherein said medium is water.

16. Apparatus as defined by claim 4, wherein said medium is water.

17. Apparatus as defined by claim 7, wherein said medium is water.

18. Apparatus as defined by claim 1, wherein said layer is formed of tin-lead solder.

19. Apparatus as defined by claim 4, wherein said layer is formed of tin-lead solder.

20. Apparatus as defined by claim 7, wherein said layer is formed of tin-lead solder.

21. Apparatus as defined by claim 11, wherein said layer is formed of tin-lead solder.

22. Apparatus as defined by claim 1, wherein the material of said layer is selected as having: an acoustic impedance that is approximately the same as the acoustic impedance of said transducer; and an ultrasound propagation velocity that is approximately the same as the ultrasound propagation velocity of said medium.

23. Apparatus as defined by claim 4, wherein the material of said layer is selected as having: an acoustic impedance that is approximately the same as the acoustic impedance of said transducer; and an ultrasound propagation velocity that is approximately the same as the ultrasound propagation velocity of said medium.

24. Apparatus as defined by claim 7, wherein the material of said layer is selected as having: an acoustic impedance that is approximately the same as the acoustic impedance of said transducer; and an ultrasound propagation velocity that is approximately the same as the ultrasound propagation velocity of said medium.

25. Apparatus as defined by claim 11, wherein the material of said layer is selected as having: an acoustic impedance that is approximately the same as the acoustic impedance of said transducer; and an ultrasound propagation velocity that is approximately the same as the ultrasound propagation velocity of said medium.

26. Apparatus for investigating a body to determine characteristics thereof, comprising:

means for generating energizing signals;

an ultrasonic transducer coupled to said energizing means for generating a beam of ultrasonic energy for transmission into said body, receiving ultrasound energy reflected from the body, and converting the received ultrasound energy to electrical signals;

means for processing said electrical signals to produce representations of the body characteristics;

a transmission medium between said transducer and said body; and a matching region disposed between a surface of said transducer and said medium, said matching region including a layer having a multiplicity of tapered elements, each of said elements tapering down in size in the direction away from said transducer and toward said medium;

a damping material; and another matching region disposed between an opposing surface of said transducer and said damping material, said another matching region including another layer having a multiplicity of tapered elements, each of said elements of said another layer tapering down in size away from said transducer.

27. Apparatus as defined by claim 26 wherein said transducer is formed of lead zirconate titanate, said medium comprises a plastic focusing lens, said layer comprises tin-lead solder, and said matching region further includes a plastic adhesive disposed between said layer and said lens.

28. Apparatus as defined by claim 27 wherein said damping material is tungsten filled epoxy.

29. Apparatus as defined by claim 27, wherein each of said multiplicity of tapered elements comprise side-by-side generally wedge-shaped elements that are elongated in the plane perpendicular to the axis of said transducer.

30. Apparatus as defined by claim 27, wherein each of said multiplicity of tapered elements comprise side-by-side generally wedge-shaped elements that are elongated in the plane perpendicular to the axis of said transducer.

31. Apparatus as defined by claim 26, wherein each of said multiplicity of tapered elements comprises a multiplicity of generally cone-shaped elements.

32. Apparatus as defined by claim 28, wherein each of said multiplicity of tapered elements comprises a multiplicity of generally cone-shaped elements.

33. Apparatus as defined by claim 26, wherein said elements are disposed in a regular pattern and have a spacing therebetween which is equal to or less than about the wavelength of the highest frequency ultrasound to be transmitted by said transducer.

34. Apparatus as defined by claim 28, wherein said elements are disposed in a regular pattern and have a spacing therebetween which is equal to or less than about the wavelength of the highest frequency ultrasound to be transmitted by said transducer.

35. Apparatus as defined by claim 30, wherein said elements are disposed in a regular pattern and have a spacing therebetween which is equal to or less than about the wavelength of the highest frequency ultrasound to be transmitted by said transducer.

36. Apparatus as defined by claim 26, wherein said layer has said multiplicity of tapered elements disposed on the surface thereof which faces away from said transducer, and wherein the wedge angle formed at the bases of said elements with respect to the direction of the axis of said transducer is less than about 20 degrees and the tapered elements are longer than about tw wavelengths of the ultrasound energy.

37. Apparatus as defined by claim 28, wherein sai layer has said multiplicity of tapered elements dispose on the surface thereof which faces away from sai transducer, and wherein the wedge angle formed at th bases of said elements with respect to the direction c the axis of said transducer is less than about 20 degree and the tapered elements are longer than about tw wavelengths of the ultrasound energy.

38. Apparatus as defined by claim 31, wherein sai layer has said multiplicity of tapered elements dispose on the surface thereof which faces away from sai transducer, and wherein the wedge angle formed at th bases of said elements with respect to the direction c the axis of said transducer is less than about 20 degree and the tapered elements are longer than about tw wavelengths of the ultrasound energy.

39. Apparatus as defined by claim 26, wherein sai layer is formed of tin-lead solder.

40. Apparatus as defined by claim 26, wherein th material of said layer is selected as having: an acousti impedance that is approximately the same as the acous tic impedance of said transducer; and an ultrasoun propagation velocity that is approximately the same a the ultrasound propagation velocity of said medium.

41. Apparatus as defined by claim 28, wherein th material of said layer is selected as having: an acousti impedance that is approximately the same as the acous tic impedance of said transducer; and an ultrasoun propagation velocity that is approximately the same a the ultrasound propagation velocity of said medium.

42. Apparatus as defined by claim 31, wherein th material of said layer is selected as having: an acousti impedance that is approximately the same as the acous tic impedance of said transducer; and an ultrasoun propagation velocity that is approximately the same a the ultrasound propagation velocity of said medium.

43. In an apparatus wherein ultrasonic energy is to b communicated between an ultrasonic transducer and transmission medium adjacent to one surface of sai transducer, the improvement comprising:

a damping material located adjacent the opposin surface of said transducer;

a matching region disposed between said opposin surface of said transducer and said damping material, said matching region including a layer havin a multiplicity of tapered elements, each of sai elements tapering down in size in the directio away from said transducer and toward said damping material.

44. Apparatus as defined by claim 43, wherein sai transducer is a lead zirconate titanate transducer, sai layer comprises tin-lead solder, and said damping material is tungsten filled epoxy.

45. Apparatus as defined by claim 43, wherein sai transducer is a lead zirconate titanate transducer, sai layer comprises tin-lead solder, and said damping material is tungsten filled epoxy.

46. Apparatus as defined by claim 44, wherein sai transducer is a lead zirconate titanate transducer, sai layer comprises tin-lead solder, and said damping material is tungsten filled epoxy.

47. Apparatus as defined by claim 43 wherein sai multiplicity of tapered elements comprises a multiplicity of generally cone-shaped elements.

48. Apparatus as defined by claim 44 wherein sai multiplicity of tapered elements comprises a multiplicity of generally cone-shaped elements.

* * * * *